United States Patent
Kuwabara

[11] Patent Number: 5,967,402
[45] Date of Patent: Oct. 19, 1999

[54] METHOD FOR JOINING MEMBERS AT ORDINARY TEMPERATURE

[75] Inventor: Mitsuo Kuwabara, Tsurugashima, Japan

[73] Assignee: Honda Giken Kogyo Kabushiki Kaisha, Tokyo, Japan

[21] Appl. No.: 09/039,446

[22] Filed: Mar. 16, 1998

[30] Foreign Application Priority Data

Mar. 25, 1997 [JP] Japan .................................... 9-072084

[51] Int. Cl.$^6$ ........................... B23K 20/00; B23K 20/22; B23K 20/233

[52] U.S. Cl. ........................................ 228/194; 228/234.3

[58] Field of Search ................................. 228/121, 122.1, 228/124.5, 194, 198, 208, 234.3

[56] References Cited

U.S. PATENT DOCUMENTS 5,273,942  12/1993  McCauley et al. .................... 501/97.1
5,812,925   9/1998  Ecer ........................................ 428/548
5,858,144   1/1999  Barton et al. .......................... 420/548

Primary Examiner—Samuel M. Heinrich
Attorney, Agent, or Firm—Birch, Stewart, Kolasch & Birch, LLP.

[57] ABSTRACT

When a metal member and a ceramic member are joined to one another, an aluminum nitride sintered compact is prepared. A liquid and a component which is mutually reactive with the liquid are applied onto the aluminum nitride sintered compact, and then a copper foil is laminated thereon. Subsequently, when the members are left to stand at room temperature, the liquid and the component mutually cause an exothermic reaction. The aluminum nitride sintered compact and the copper foil mutually diffuse, and they are tightly joined to one another. Accordingly, the members to be joined are not thermally affected, and a desired joining strength can be obtained by using simple equipment.

5 Claims, 2 Drawing Sheets

FIG. 1

ST1: ALUMINUM NITRIDE SINTERED COMPACT

ST2: PLACE COPPER FOIL

ST3: LEFT TO STAND AT ROOM TEMPERATURE

FIG. 2

ST1a: ALUMINUM NITRIDE SINTERED COMPACT

ST2a: OXIDATION

ST3a: SCREEN PRINTING

ST4a: HEATING

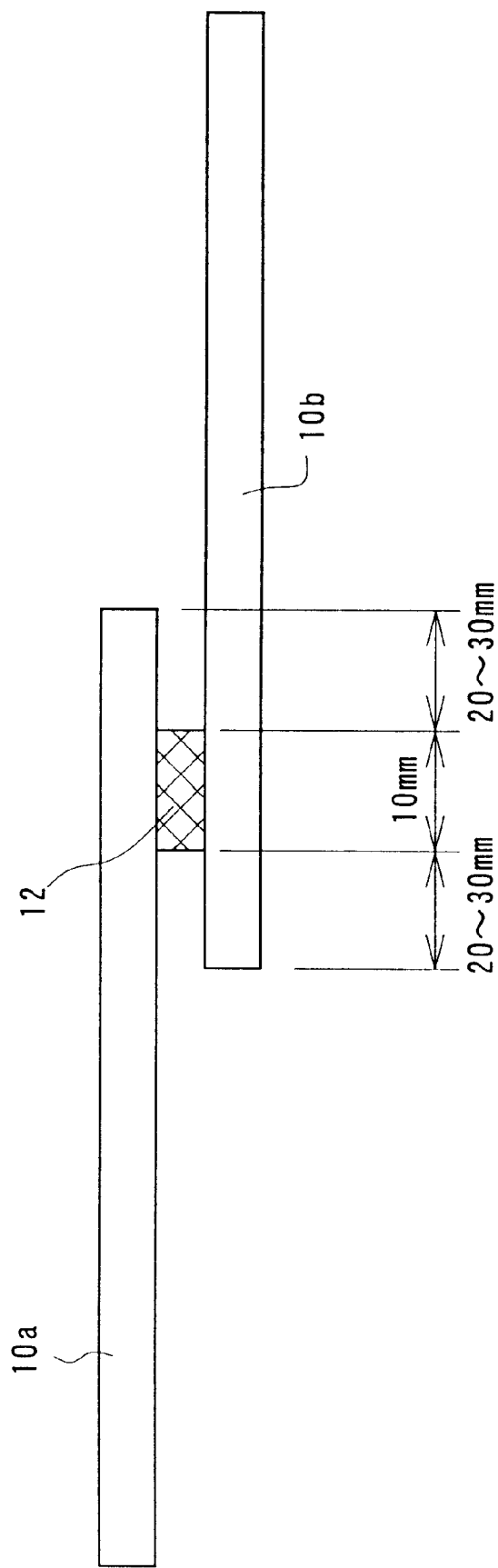

METHOD FOR JOINING MEMBERS AT ORDINARY TEMPERATURE

BACKGROUND OF THE INVENTION

1. Field of the Invention

The present invention relates to a method for joining members at ordinary temperature for joining a first member and a second member to one another at ordinary temperature.

2. Description of the Related Art

In general, those widely adopted for joining a metal member to another metal member or for joining a metal member to a ceramic member include, for example, the brazing method based on the use of a brazing material, the diffusion brazing method, the friction welding method, and a variety of the welding methods such as the MIG welding and the spot welding.

When such members are joined to one another by means of the brazing method, a brazing material is arranged between the members to be joined. Local heating is effected, for example, by using a burner to heat the brazing material to a temperature not less than its melting point. Thus, the members are joined to one another. However, the brazing method involves the problem that mutual diffusion of components scarcely occurs between the members, and the joining strength is low.

In the case of the diffusion brazing method, the members, which are used as base materials for joining, are heated to a high temperature. Therefore, mutual diffusion of components occurs between the members, and it is possible to obtain a joining strength which is higher than that obtained by the brazing method. However, the diffusion brazing method involves the problem that deformation occurs in addition to annealing and thermal distortion. Further, in the case of the various types of welding methods, the joining strength per unit area is increased, because the metal to be joined is melted. However, the welding methods involve the problem that the deformation of the joined portion is increased.

As described above, in the case of the respective joining methods described above, it is known that the distortion hysteresis remains at ordinary temperature, and the thermal distortion appears, because the metal or the ceramic to be joined is exposed to a high temperature. Further, for example, the distortion is also caused by partial application of heat, and the fatigue characteristic is affected thereby. Thus, various troubles arise due to the application of heat.

In order to avoid the occurrence of thermal distortion, the friction welding method is adopted, as a joining method for performing joining at ordinary temperature or in the vicinity thereof. In the case of the friction welding method, atoms of both members to be joined make direct diffusion, in which it is possible to obtain an extremely high strength, and it is possible to effectively reduce the occurrence of distortion.

However, in the case of the friction welding method described above, a lot of burrs are formed at the joined portion between the members. Therefore, it is necessary to remove the burrs in the next step. For this reason, the following problem is pointed out. That is, special equipment is required to remove the burrs, and the size of joinable member is restricted.

SUMMARY OF THE INVENTION

An object of the present invention is to provide a reliable method for joining members at ordinary temperature, in which the members to be joined are not thermally affected, and it is possible to obtain a desired joining strength by using simple equipment.

In the method for joining members at ordinary temperature according to the present invention, at first, a specified liquid and a component which mutually reacts when the liquid is in a state of not more than a predetermined critical point are arranged between metals or between a metal and a ceramic to be joined to one another. The component is used in a form of powder, in a form of paste, or in a form of plate of ceramic or metal.

At this stage, the reaction is started in an accidental manner in some cases due to volatilization of the liquid content. Various additives are used in order to control such a reaction. That is, the reactive component is highly reactive with the selected liquid, and the reaction gradually proceeds during storage to cause decrease in liquid component, or a reaction product is produced due to the reaction. This causes deficiency or lack of the reactive component or the reactive species when it is intended to cause the reaction, i.e., when the joining is actually performed.

Therefore, it is necessary that the liquid component and the reactive component, which serve as the reactive species, are isolated from each other during storage. Capsulation of the liquid component is adopted as a technique to effect the isolation, because of the following reason. That is, the capsulation decreases the contact points between the liquid component and the reactive component as the reactive species.

The liquid has a property that it becomes spherical by the aid of the surface tension when its amount is decreased. An additive is uniformly dispersed beforehand, and a protective film is formed at the surface of the liquid by decreasing the amount of the liquid so that the capsulation is effected. Desirably, the capsulation is effected such that destruction easily occurs by the aid of an external action such as application of pressure or heat, and the internally capsulated liquid component as the reactive species contacts with the reactive component to cause the reaction. This is because of the following reason. That is, the larger the number of reaction start points is, the larger the number of ignition sources of the reaction is. Therefore, a vigorous exothermic reaction is caused and continued, and thus it is possible to obtain a joinable energy.

The capsulation is not made completely. The capsule is constructed such that there are cracks of the protective film and a few exposed portions, from which the liquid content is capable of evaporation. Accordingly, when the cracks or the like exist in a degree smaller than that of the liquid surface energy as the source of the surface tension, the reaction does not take place during storage. The balance disappears due to a slight amount of external force, and the liquid leaks to make it possible to suddenly start the reaction, which is advantageous. If the amount of the additive to be used for the capsulation is increased, then the energy required to allow the liquid to be in the state of not more than the critical point is increased, and it becomes impossible to cause the reaction at ordinary temperature or in the vicinity thereof.

Those adopted as the liquid include various ones represented by water as well as alcohols such as ethanol, amines, and esters. The liquid is selected on the basis of the metal to be joined and the metal to be reacted with the liquid. Specifically, the liquid is determined depending on the required characteristic, such as an intention to facilitate oxidation and an intention to perform joining in a state in which oxidation is suppressed.

Usually, those used, for example, as a dispersing agent or a binder for ceramic or metal powder may be used as the additive. However, it is necessary that the binder is added in an amount which is set to be about ⅟10 as compared with the amount used during formation or molding of the powder. If the binder is added in an excessive amount, the surface tension of the liquid is suppressed, providing the function similar to that of a developing agent used for an adhesive or the like. In such a situation, the liquid is uniformly dried, and it becomes difficult to capsulate the liquid. Further, even if the liquid is capsulated, the coating strength of an obtained capsule is too high, which results in the increase in energy required to destroy the capsule to cause the reaction. In such a situation, it is impossible to perform the joining treatment at ordinary temperature or in the vicinity thereof.

On the other hand, the additive, which functions like a dispersing agent to be used during dispersion for powder, is added in an amount which is set to be not less than two or three times the amount usually used for molding or forming ceramic or metal, because of the following reason. That is, in order to contemplate the capsulation of the liquid, it is necessary to raise the surface tension so that a state like soap bubbles is achieved. It is necessary to set the amount to be in a range exceeding the conventional quantitative range.

The reactive liquid, which has been capsulated as described above, is allowed to be interposed between the members to be joined together with the component which causes a vigorous mutual exothermic reaction with the liquid. The component is roughly classified into the ceramic, the metal, and the organic metal which are appropriately selected on the basis of, for example, the type of joining. When the ceramic is used as the component, the joined portion and the vicinity thereof are composed of a composite material owing to dispersion of the ceramic. Thus, a large strength is obtained. When the metal is used as the component, two forms are provided, i.e., forms of ceramic and metal. On the other hand, when the organic metal is used, the construction is made as a metal.

Such a component is used in a form of powder, liquid, or plate, which may be selected in consideration of the characteristic to be obtained. For example, when the component to be reacted with the liquid is a liquid, then the both are sufficiently mixed immediately before the joining, an obtained mixture is thinly applied to both metals to be joined, and the metals are overlaid with each other. Accordingly, the amount of the liquid content is decreased between the metals, and when a state of not more than the critical point of the liquid is given, then the both liquids immediately cause the exothermic reaction in a vigorous manner, and the temperature of the joined portion of the both metals is quickly raised. During this process, the component of the liquid partially diffuses into the inside of the metals, and the both metals themselves mutually make diffusion. Thus, the joining process is advanced.

In order to enhance the reliability of the joining, the metal may be pressurized, for example, at a pressurizing pressure of 10 to 100 MPa. The application of pressure suppresses the void which would otherwise tend to appear at the joined portion, it decreases the distance between substrates for the reaction, and it improve the heat transfer efficiency, making it possible to obtain a good joining state. When the joining is performed simultaneously with plastic deformation to give a shape, the pressurizing pressure may be not less than 100 MPa.

When a liquid is used as the component to react with the liquid, it is preferable to use, as an adhesive agent, for example, nitrocellulose and polyvinyl acetate. Accordingly, it is possible to increase the amount of the reaction, and it is possible to obtain a large amount of heat generation.

The case of the use of a powder to be reacted with the liquid is exemplified by the use of water as the liquid and the use of aluminum nitride as the powder. In this reaction, ammonia is produced as a reaction gas.

Accordingly, at first, the dispersing agent and the additive are added and mixed in a water dispersion system, and then the amount of water content is decreased to capsulate the water beforehand. Next, an obtained preparation is thinly applied between the metals to be joined, and the amount of water content is progressively decreased. Thus, the exothermic reaction is vigorously started at the critical point or less, which causes sintering and fusion of the ceramic powder and local melting of the metals to be joined. As a result, mutual diffusion occurs between the metals to be joined, and the joined portion is converted into a composite material.

Upon the joining as described above, those converted into the composite material have high binding strength. However, when it is intended to suppress the behavior as the intervening matter, it is preferable to use a metal powder. Further, it is possible to make control not to cause ceramic formation by selecting the metal. Those applicable to such a metal powder include, for example, rare earth elements such as cerium (Ce), yttrium (Y), neodymium (Nd), samarium (Sm), dysprosium (Dy), and lanthanum (La), as well as aluminum (Al), magnesium (Mg), and lithium (Li). On the other hand, when ceramic formation is not effected, it is necessary that the metal is added with, for example, chromium (Cr), molybdenum (Mo), tungsten (W), tantalum (Ta), nickel (Ni), cobalt (Co), and titanium (Ti), simultaneously with which those having a reducing ability are selected as those used for the reaction-objective liquid.

The above and other objects, features, and advantages of the present invention will become more apparent from the following description when taken in conjunction with the accompanying drawings in which a preferred embodiment of the present invention is shown by way of illustrative example.

DESCRIPTION OF THE DRAWINGS

FIG. 1 illustrates steps of a cold joining method according to a first embodiment of the present invention.

FIG. 2 illustrates conventional production steps corresponding to those used in the first embodiment.

FIG. 3 illustrates members and a joining agent used for a cold joining method according to a second embodiment of the present invention.

DESCRIPTION OF THE PREFERRED EMBODIMENTS

A cold joining method or a method for joining members at ordinary temperature according to a first embodiment of the present invention will be explained below. In the first embodiment, a method for joining a metal and a ceramic will be explained below with reference to FIG. 1.

At first, an aluminum nitride sintered compact containing 3% of yttrium oxide and calcium oxide was prepared as the ceramic (step ST1). On the other hand, a thin film made of pure copper having a thickness of 12 $\mu$m was set to be used as the metal subjected to joining.

Next, an aluminum nitride fine powder was set, with respect to a metallic aluminum fine powder and a nickel fine powder, to be in a weight ratio of 96.5:3:0.5 to prepare a powder which was added with a solution of ammonium alginate and carbamic acid ester as a dispersing agent in an amount of 8 wt %, or substantially in an amount of 0.4 wt % and which was further added and mixed with an acrylic resin emulsion in an amount of 1 wt %.

The water content of the mixed joining agent was adjusted to be 12 wt %. After that, the joining agent was thinly applied to the side for carrying a copper foil, of the aluminum nitride plate. The copper foil was placed thereon, and a weight was arranged thereon (step ST2). The aluminum nitride plate had a plate-shaped configuration of 2×2×0.0025 inch. The copper foil had the same size, and the weight was set to be 1 kg. The laminated compact was left to stand at room temperature (not more than 100° C.) (step ST3). As a result, the generation of heat was started after passage of 30 minutes, and an exothermic reaction occurred immediately. After passage of 1 hour, the weight was removed to perform observation. As a result, a good joined state was obtained.

The joined surface was cut and sectioned, followed by mirror-finished polishing to perform stereoscopic microscope observation and electron microscopic observation. As a result, the joined surface was substantially uniform. Further, according to the line analysis performed by using the electron microscope, there were caused diffusion of the aluminum component into the copper and diffusion of the copper component into the aluminum nitride. Thus, it was demonstrated that a firm joined state was obtained.

Moreover, in the first embodiment, it is sufficient for the joining process for the metal and the ceramic to substantially comprise the three steps (see FIG. 1). Usually, as shown in FIG. 2, in the joining process of this type, it has been necessary to provide a step of oxidizing the surface of the aluminum nitride sintered compact by applying a heat treatment in atmospheric air (step ST1a and step ST2a), because there is no eutectic region for copper and nitrogen.

In the conventional process, a copper thin film is then glued to the aluminum nitride sintered compact, or a paste is printed thereon (step ST3). The heating is performed up to an eutectic point for copper and oxygen or the vicinity thereof to make joining (step ST4a). Therefore, in the first embodiment, it is unnecessary to provide the conventional oxidation step and the heating step, providing an effect that the entire joining process is simplified and it is performed quickly.

Next, a second embodiment will be described, concerning joining of a metal to a metal. Especially, a method for joining an aluminum alloy plate to another aluminum alloy plate will be explained below.

As shown in FIG. 3, for example, aluminum plates 10a, 10b of AlP5182 (JIS) were prepared. Each of the aluminum plates 10a, 10b had a plate thickness of 2.0 mm. They were cut into a size of 40×100 mm, between which a joining agent 12 containing a reactive metal and a liquid was arranged in a state in which parts of the aluminum plates 10a, 10b were superimposed with each other. The joining agent 12 was disposed at a position separated from ends of the aluminum plates 10a, 10b by 20 to 30 mm respectively with a joining width set to be 10 mm. The following four types shown in Table 1 were adopted as the joining agent 12. The tensile shearing strength was determined as the joining strength of the aluminum plates 10a, 10b joined by the respective joining agents 12.

TABLE 1

Cold joining agent for Al and tensile shearing strength

| Reactive metal | Liquid | Tensile shearing strength (MPa) |
|---|---|---|
| LiAlH$_4$ | ethanol | 200 to 260 |
| LiBH$_4$ + Cr | ethylamine | 180 to 230 |
| Ce + Sm + Co | ethanol + water | 180 to 210 |
| Cr + La + Hf + Ni + Dy | methylamine + ethanol + water | 180 to 240 |

The joining operation was performed by using the same materials, based on the use of the conventional spot welding method as Comparative Example. The joining condition was as follows. That is, the welding was performed with a large current of 35000 A allowed to flow over 12 to 16 cycles while applying a load of 600 kgf as a pressurizing pressure by using electrodes having an electrode diameter of 19 mm and a tip R of 150. In the spot welding, defects were formed in a produced nugget (joined portion) due to blow hole of hydrogen or the like, and the welded portion suffered from cracks. Heat generation was caused by application of the current, a large dent was brought about due to softening, and the quality of appearance was deteriorated. In this procedure, the tensile shearing strength of the joining achieved by the spot welding was about not more than 160 MPa at 800 to 1000 kgf/φ9 to φ11 mm.

Accordingly, the joining strength obtained in the second embodiment was considerably higher than that obtained by the conventional spot welding. Further, the second embodiment was advantageous in that it was unnecessary to generate any large current which would be otherwise required for the spot welding, making it possible to greatly reduce the installation cost.

Explanation will be made below for the joining for iron materials, as a third embodiment of the present invention. In this embodiment, those usable as the liquid and the component which are mutually reactive include the same as those used for the joining between the aluminum alloy and the aluminum alloy according to the second embodiment. However, it was feared, for example, that aluminum and lithium would deteriorate the characteristic of the joined portion, and hence they were not used.

Those used as the component reactive with the liquid include, for example, lanthanoid element including lanthanum (La) and cerium (Ce), manganese (Mn), chromium (Cr), vanadium (V), tungsten (W), molybdenum (Mo), yttrium (Y), tantalum (Ta), and niobium (Nb). Those used as auxiliary elements include, for example, iron metals, titanium (Ti), zirconium (Zr), hafnium (Hf), and carbon (C).

Those used as the liquid include, for example, alcohols, amines, and water as described above. Further, the velocity of the reaction and the amount of heat generation may be adjusted, and the oxidation may be controlled to be accelerated or suppressed, by using ester, amide, organic acid such as formic acid, butyric acid, and benzoic acid.

SCM430 having been heat-treated was employed as the iron material, and it was processed into test pieces of JIS No. 10. A part of the test pieces were cut at their central portions. Next, the test pieces were subjected to joining by using the brazing and the diffusion brazing as Comparative Examples, and by using A, B, and C concerning the third embodiment. A nickel brazing material (BNi-1) was used as the brazing material. In the diffusion brazing, a heat treatment was performed after the joining. The following liquids and components shown in Table 2 were used in A, B, and C concerning the third embodiment.

TABLE 2

| | Liquid to be reacted | Substance reactive with liquid |
|---|---|---|
| A | methyl alcohol + water | La + Cr + Mo |
| B | acetic acid + water + NH$_4$OH | Sm + Mn + V |
| C | ethanolamine | Ce + Dy + Cr + Ni |

The tensile test was performed after the joining, and results were obtained as shown in the following Table 3.

TABLE 3

| | Comparative Example | | Example | | |
|---|---|---|---|---|---|
| | | diffusion | | | |
| Joining method | brazing | brazing | A | B | C |
| Tensile shearing strength (MPa) | 80 | 290 | 780 | 80 | 1100 |

In the case of the brazing, the tensile shearing strength was about 100 MPa. In the case of the diffusion brazing, the tensile shearing strength had a value of about 300 MPa. On the contrary, in the case of the use of A, B, and C according to the third embodiment, the obtained joining strength was two times or more as compared with those obtained by the diffusion brazing.

As described above, according to the method for joining members at ordinary temperature concerning the present invention, the joining treatment is performed at ordinary temperature or in the vicinity thereof. Therefore, the joining strength is high, there is no thermal influence, and, for example, it is possible to effectively avoid occurrence of distortion or the like. Further, when metals are joined to one another, or when a metal is joined to a ceramic, it is almost unnecessary to heat the metal and the ceramic by selecting the liquid and the component which are reactive with each other. Accordingly, an extremely high strength and joining reliability can be obtained owing to the mutual diffusion. Moreover, it is unnecessary to provide any special heating treatment apparatus, and it is possible to reduce the installation cost.

What is claimed is:

1. A method for joining members at ordinary temperature, comprising the steps of:

arranging, between a first member and a second member, at least one liquid selected from the group consisting of water, alcohols such as ethanol, amines such as methylamine, organic acids such as carbamic acid, and esters such as ethyl acetate, and a component which is mutually reactive with said liquid when said liquid is in an amount of not more than a predetermined amount; and allowing said liquid to be in a state of not more than said predetermined amount at a temperature not more than 100° C. so that said liquid and said component react with each other, and said first member and said second member are allowed to cause mutual diffusion to be joined to one another in an integrated manner.

2. The method for joining said members at ordinary temperature according to claim 1, wherein said component is composed of at least one element selected from the group consisting of lithium, magnesium, aluminum, titanium, zirconium, hafnium, vanadium, manganese, chromium, yttrium, and lanthanoid elements such as cerium, neodymium, samarium, and dysprosium including lanthanum.

3. The method for joining said members at ordinary temperature according to claim 2, wherein at least one element selected from the group consisting of molybdenum, tungsten, tantalum, cobalt, nickel, iron, copper, and silver is added, in addition to said component.

4. The method for joining said members at ordinary temperature according to claim 1, wherein when said first and second members are composed of an iron material, said component is at least one element selected from the group consisting of lanthanoid elements including lanthanum and cerium, manganese, chromium, vanadium, tungsten, molybdenum, yttrium, tantalum, and niobium.

5. The method for joining said members at ordinary temperature according to claim 4, wherein at least one element selected from the group consisting of iron metal, titanium, zirconium, hafnium, and carbon is added, in addition to said component.

* * * * *